United States Patent [19]

Oliver

[11] 4,023,110
[45] May 10, 1977

[54] PULSE COMPARISON SYSTEM

[75] Inventor: Calvin W. Oliver, Kernersville, N.C.

[73] Assignee: The United States of America as represented by the Secretary of the Army, Washington, D.C.

[22] Filed: Dec. 4, 1975

[21] Appl. No.: 637,792

[52] U.S. Cl. .............................. 328/109; 307/232; 307/234; 307/262; 307/293; 328/55; 324/188
[51] Int. Cl.² ......................................... H03K 5/20
[58] Field of Search .......... 307/232, 262, 234, 293; 328/109, 110, 119, 55; 324/188

[56] References Cited
UNITED STATES PATENTS

| 2,888,647 | 5/1959 | Beter et al. | 324/188 |
| 3,037,166 | 5/1962 | Alexander | 324/188 |
| 3,693,167 | 9/1972 | Teurnier | 307/232 |
| 3,755,747 | 8/1973 | Letosky | 307/232 |
| 3,904,894 | 9/1975 | Ciolli | 307/232 |

Primary Examiner—Stanley D. Miller, Jr.
Attorney, Agent, or Firm—William G. Gapcynski; Lawrence A. Neureither; Robert C. Sims

[57] ABSTRACT

The position of one pulse relative to a reference pulse is obtained by having the one pulse set a string of flip-flops until the setting is inhibited by a stop signal generated by the second pulse. The condition of the flip-flops is read by an encoded network.

1 Claim, 2 Drawing Figures

PULSE COMPARISON SYSTEM

DESCRIPTION OF THE PREFERRED EMBODIMENT

Figure 1:
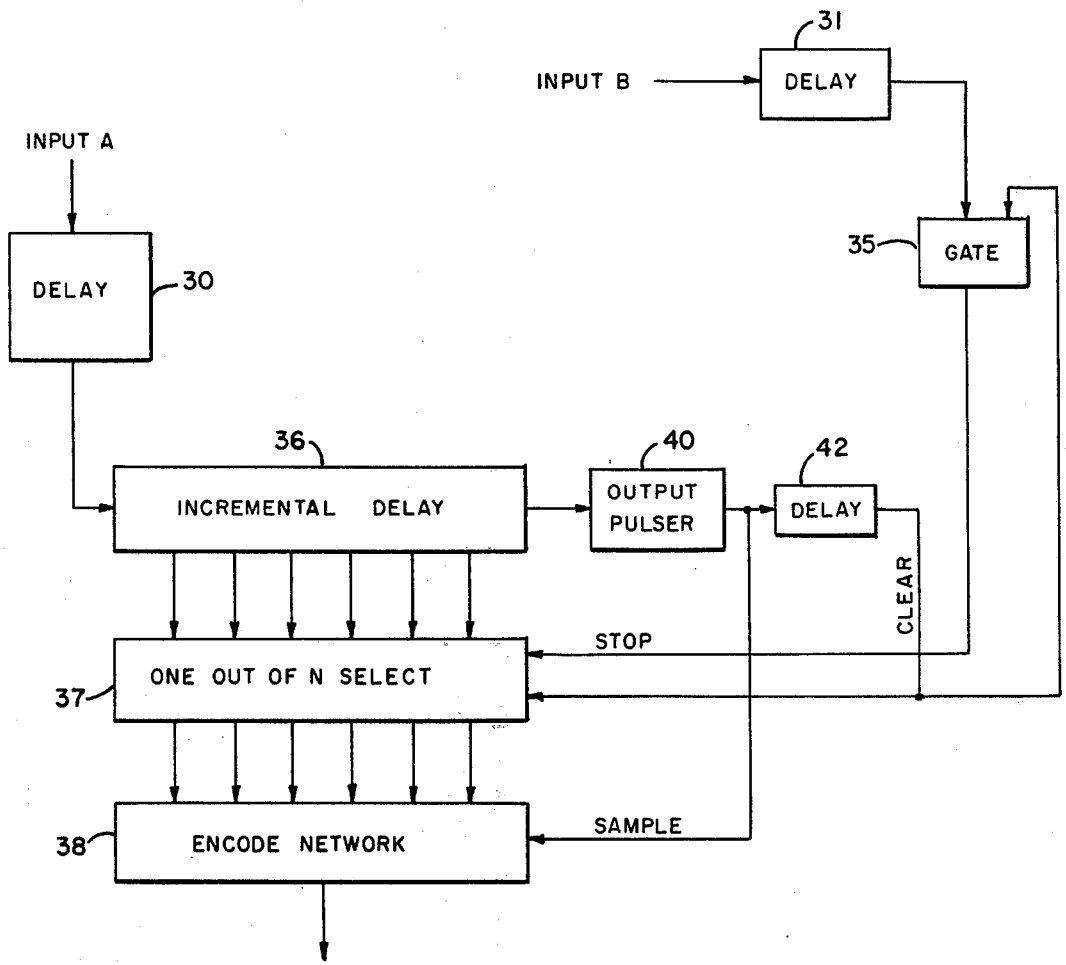
FIG. 1 is a block diagram showing the preferred embodiment of the present invention.

This invention is directed to a system for measuring the position of a synchronization pulse in relationship to a reference pulse andd providing outputs which represent the relative pulse positions. The basic embodiment of the invention is illustrated in FIG. 1. Two input pulses input A and input B are to be compared. These pulses are fed through delay means 30 and 31 so as to change their relative timing if necessary. For example if input A and input B were designed to be exactly synchronized then the delay 31 could be made for a longer period of time than delay 30 so that input B would reach gate 35 a half cycle later than input A reaches the incremental delay circuit 36. The inputs A and B need not be of the sme frequency but need only to have a definite relationship to each other. For example input A could be a synchronization pulse with which the two signals are to be compared.

FIG. 1 shows that input A is fed to incremental delay circuit 36 where it will process through the plurality of outputs in incremental steps of time. This in turn will allow the setting of a series of flip-flops and the one-of-N select circuit 37. The flip-flops are set one at a time in accordance with the travel of the input A across incremental delay 36. When input B causes gate 35 to change, a stop signal is sent to the one-of-N select circuit 37 so as to prevent any further changing of the conditions of the flip-flops and the circuit. Therefore the flip-flop that is set at that particular time will be an indication of the time difference between the delayed inputs A and B. An encoding device 38 is connected to the device 37 so as to provide an output which will be coded to indicate the time difference between input A and B. The coding of encode network 38 will take into account any differences in the delay networks 30 and 31. The output of the encode network can be used to provide corrections so as to properly synchronize the two inputs. After input pulse from A travels through incremental delay 36, it goes to output pulser 40 which provides a sample signal output which is fed to encoder 38. Encoder 38 can take the shape of any of the well known encoding devices such as that shown in "Electronic Circuits Manual", pages 204-208 (see especially page 205), by John Markus, McGraw-Hill Book Company, 1971, Library of Congress catalog card number 70-152007. Output pulser 40 is also fed through a delay means 42 to clear the flip-flops in device 37 and also to change the setting of gate 35 so as to eliminate the stop signal to network 37.

Figure 2:
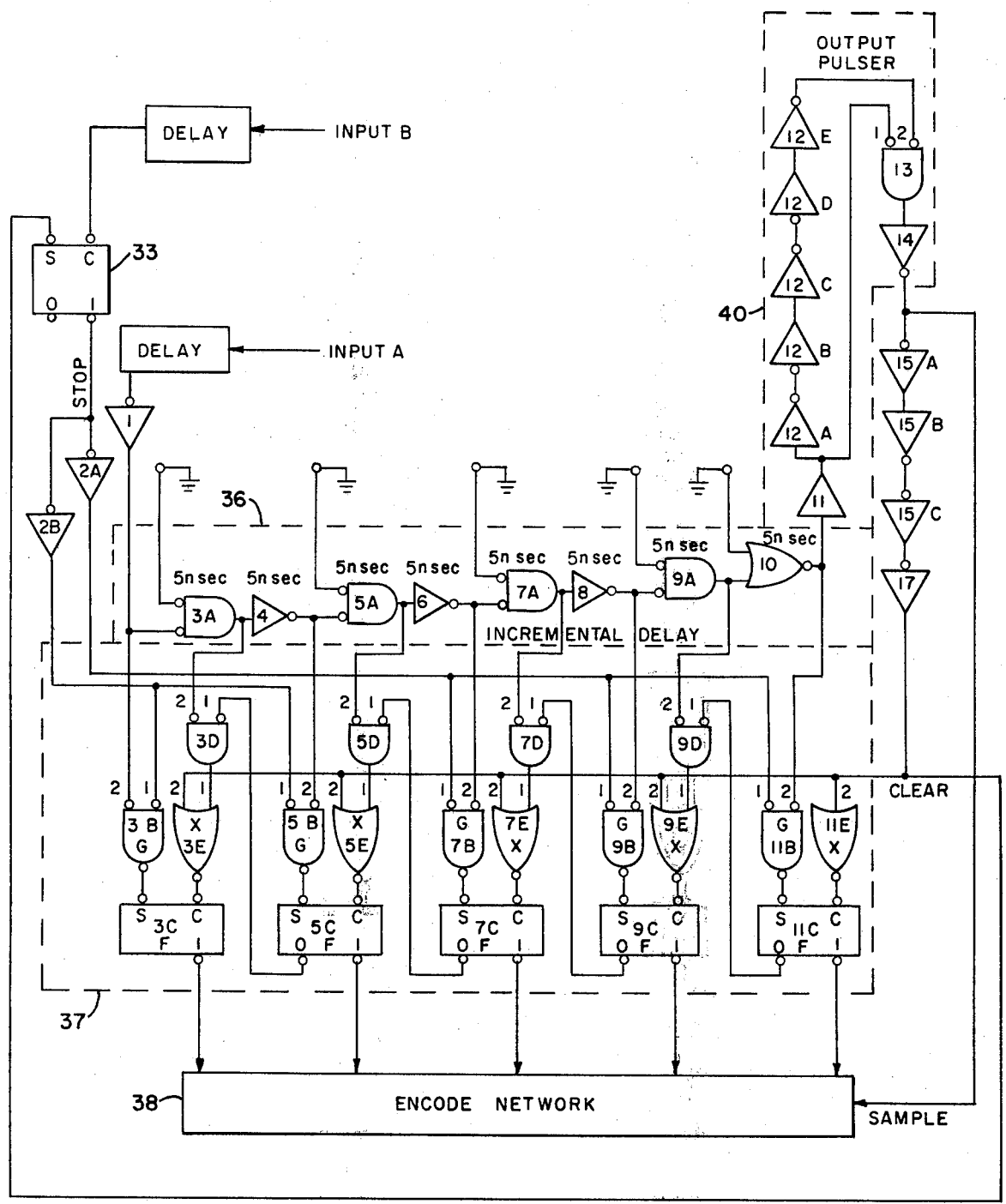
FIG. 2 is a schematic diagram illustrating in greater detail the preferred embodiment of the present invention.

The invention is shown in geater detail in FIG. 2. The small circles drawn at the inputs and/or at the outputs of some circuit elements indicate inversions. The schematic diagrams depicted use the standard logic symbols of the SAFEGUARD logic family. These symbols are used in accordance with certain rules which make it easier for those familiar with that particular logic family to identify which logic levels are the forcing functions of the circuit. As a consequence of this representation approach, some very standard circuit elements assume unusual presentations. For example, gate 3B in FIG. 2 shows an "AND" gate with an inversion at each input and an inversion at the output. If A and B are the two gate inputs, the Boolean expression for this circuit is $\overline{\overline{A} \cdot \overline{B}}$. By the well known DeMorgan's theorem, this expression can be shown to be equivalent to A+B, which, of course, is the expression for an OR gate. Similarly, gate 3D can be shown to be equivalent to a NOR gate. The flip-flops illustrated in the drawings are flip-flops used in the NIKE-X system, which are equivalent to single input inverters which are cross coupled. That is the reason for placing the inversion designations at the output of the flip-flops. The inversion designations at the inputs to the flip-flops simply indicate that logic "0" level is the forcing function in these units; namely, a logic "1" level does not affect the flip-flop, while the logic "0" level does.

The "G" and "X" gates are extender type gates used in the SAFEGUARD logic family. These gates are open collector gates, the use of which was necessitated by the particular configuration of the flip-flops. However, as indicated above, the G gates act as OR gates and the X gates act as NOR gates.

The detailed circuit shown in FIG. 2 can best be described by subdividing time into five nanosecond increments, because this is the increment of delay that each logic element contributes to the circuit. Assuming, therefore, that all flip-flops are initially "cleared" at time T(-1), and input A is at logic "0" level. The STOP signal appears at input 1 of gates 3B, 5B, 7B, 9B, and 11B as a logic "0" level, while input 2 of these gates is at logic "1" level. When the sync pulse arrives at T(0) after the delay caused by delay circuits 30 and 31, the input to inverter 1 switches to logic "1" level. At T(1) inverter 1 inverts the signal and presents a logic "0" level to its output, which, in turn, presents the logic "0" level to input 2 of the gate 3B. Thus, at T(1) both inputs to OR gate 3B are at logic "0" level, and consequently at T(2) the output of gate 3B goes low and "sets" flip-flop 3C. The flip-flop achieves the "set" state at T(3). At T(1) signal A, as a logic "0" level, also arrives at the input to gate 3A. Gates 3A, 5A, 7A, 9A, and 10 are drawn as gate packages, but since each has one input at ground level, this means that functionally these gates are simple inverters. At T(2) the signal arrives at the input package to inverter 4 as a logic "1" level and at T(3) it appears at the input to gate 5A and input 2 of gate 5B as a logic "0" level. If the STOP signal has not changed (input 1 of gate 5B is still low), at T(3) both inputs to OR gate 5B are low, and therefore at T(4) flip-flop 5C is "set", and the "set" state is reflected in the flip-flop's output at T(5). Prior to T(5) flip-flop 5C was "cleared" (before T(-1)), therefore, flip-flop 5C applies a logic "1" level at input 1 of gate 3D, and prior to T(2) gate 3A is at logic "0" level applying this level to input 2 of NOR gate 3D. Accordingly, up to T(3) the output of gate 3D is at logic "0" level. At T(2) input 2 of gate 3D goes high and at T(5) input 1 of gate 3D goes low. Since gate 3D is a NOR gate, and since T(2) is prior to T(5), input 2 of gate 3D effectively inhibits the low signal on input 1 of 3D (at T(5)) and, the output signal of gate 3D remains at logic "0" level. The "cleared" line is at logic "0" level until T(37) (as will hereinafter be described). Therefore, NOR gate 3E output is high and consequently flip-flop 3C is not reset.

At T(4) the signal arrives at the output of 5A as a logic "1" level, inhibiting gate 5D, as gate 3D was inhibited, and at T(5) a logic "0" level signal arrives at the input to gate 7A and at input 2 of gate 7B. If the stop signal has not yet arrived, input 1 of gate 7B will still be at logic "0" level allowing the FULL SYNC pulse to "set" flip-flop 7C at T(6). Similarly, flip-flop 9C would be "set" at T(8), and flip-flop 11C would be "set" at T(10).

At one point in time input B (after delay caused by 31) switches to logic "0" level causing flip-flop 33 to change. Assuming, for example, that this occurs at time T(3-) (a little before T(3)), the output of inverters 2A and 2B switches to logic "1" level at T(4-). Since the signal at input 2 of gates 3B and 5B switched to logic "0" level at T(1) and T(3), respectively, the "setting" of flip-flops 3C and 5C is unaffected. However, input 2 of gate 7B switches to logic "0" level at T(5), while input 1 of OR gate 7B switches to logic "1" level at T(4-). Consequently the output of gate 7B remains at logic "0" level and flip-flop 7C is not "set". Similarly, under the above assumption as to the arrival of the stop input signals flip-flops 9C and 11C are not "set".

When input A pulse returns to logic "0" level after 100 nanoseconds, at T(20), the input to inverters 1, 2A, and 2B switches to a logic "0" level, and at T(21) the input to gate 3A annd to input 2 of gate 3B switches to logic "1" level. The change in input to gate 3B does not affect the circuit because input 1 of the OR gate 3B is already at logic "1" level. The negative transition of the input to gate 3A propagates through gates 3A, 4, 5A, 6, etc. At T(22) the output signal level of gate 3A and the input to gate 3D, having two logic "0" levels at its inputs (since flip-flop 5C was "set") produces a logic "1" level output at T(23). Further, since the CLEAR signal is low until T(37), the logic "1" level on input 1 of NOR gate 3E produces a logic "0" level at the output of gate 3E at T(24), thereby "clearing" flip-flop 3C so that its 1 output goes to logic "0" level at T(25). If flip-flop 5C was not "set", then its 0 output, which is connected to input 1 of NOR gate 3D, is at logic "1" level. Consequently, the signal level transition of input 2 of gate 3D is not reflected in its output and flip-flop 3C is not "cleared". At T(24) the output signal of gate 5A and the input signal of gate 5D switches to logic "0" level. If flip-flop 7C was previously "set", then gate 5D switches to logic "1" level at T(25) and at T(26) "clears" flip-flop 5C. However, for the purposes of this description, the "setting" of flip-flop 7C was inhibited by the arrival of the stop input signal, input 1 of gate 5E is at logic "1" level inhibiting a change in the output signal level of the gate and inhibiting a change in the state of flip-flop 5C. Thus, the trailing edge of the A signal propagates down the incremental delay section "clearing" each flip-flop if, and oly if, the next flip-flop in the chain is "set". This leaves only the last flip-flop to be "set" (flip-flop 5C) in the "set" state.

The 100 nanosecond positive pulse A appears at the output of inverter 11 between T(10) and T(30). Inverters 12A-E provide a delay of five time intervals and an inversion. Accordingly, input 1 of NOR gate 13 is at logic "0" level following T(30), while input 2 of gate 13 is at logic "0" level between T(15) and T(35). The output of gate 13 is a positive pulse between T(31) and T(36). This pulse is inverted by unit 14 and is applied to input 2 of NOR gate 19 and to inverter 15A. Inverters 15A, 15B, 15C, 16, and 17 are used to delay the pulse output of inverter 14 to insure proper operation of encode network 38 prior to the "clearing" of all the fliip-flops. Accordingly, the output of gate 17 is a pulse starting at T(37), which is applied to input 2 of all the "X" NOR gates. At T(38) the output of all the NOR gates is forced to logic "0" level and the particular flip-flop which is still in the "set" state is reset and assumes the "clear" state at T(39). When all this takes place, the STOP input is returned to a logic "1" level by flip-flop 33, and the circuit is ready for the next input.

I claim:

1. In a system for comparing a first pulse input, with a second pulse input with respect to time, the improvement comprising a plurality of incremental delay means connected to the first input; a series of settable gate means connected to said incremental delay means so as to successfully set said series of gate means in accordance to the travel of said first input through the incremental delay means; first connecting means connected between the second input and said series of settable gate means so as to inhibit any further setting of said gate means upon receiving a signal from said second input; encoding means connected to said series of settable gate means so as to indicate the condition of said settable gate means said series of settable gate means is a series of flip-flops; said incremental delay means having a series connection of delay devices each individually connected to a separate one of said series of flip-flops; first and second delay means; said first delay means being connected between said first input and said incremental delay means; said second delay means being connected between said second input and said series of settable gate means; and a pulser means connected to the output of the incremental delay means and connected to said encoding means so as to cause said encoded means to produce an output.

* * * * *